United States Patent [19]

Fuse

[11] Patent Number: 5,005,029
[45] Date of Patent: Apr. 2, 1991

[54] TRANSMITTING RADIATION THROUGH A FLEXIBLE PRINTED CIRCUIT TO AN OPTICAL FIBER BUNDLE

[75] Inventor: Masashi Fuse, Morioka, Japan

[73] Assignee: Alps Electric Co., Ltd., Tokyo, Japan

[21] Appl. No.: 509,109

[22] Filed: Apr. 13, 1990

Related U.S. Application Data

[62] Division of Ser. No. 228,886, Aug. 4, 1988, Pat. No. 4,929,965.

[30] Foreign Application Priority Data

| Sep. 2, 1987 | [JP] | Japan | 62-220007 |
| Sep. 2, 1987 | [JP] | Japan | 62-220008 |
| Nov. 7, 1987 | [JP] | Japan | 62-281343 |
| Nov. 7, 1987 | [JP] | Japan | 62-281344 |
| Nov. 7, 1987 | [JP] | Japan | 62-281342 |
| Nov. 7, 1987 | [JP] | Japan | 62-281345 |

[51] Int. Cl.$^5$ .............. G01D 9/42; G02B 6/08; H01L 33/00
[52] U.S. Cl. .............. 346/107 R; 346/160; 350/96.27; 362/800; 357/17
[58] Field of Search .............. 346/107 R, 160, 108; 355/1; 350/96.24, 96.25, 96.27; 362/800; 357/17

[56] References Cited

U.S. PATENT DOCUMENTS

| 4,549,784 | 10/1985 | Inokuchi | 350/96.27 |
| 4,820,013 | 4/1989 | Fuse | 346/107 R |
| 4,827,290 | 5/1989 | Yoritomo | 346/107 R |

Primary Examiner—Benjamin R. Fuller
Assistant Examiner—Scott Rogers
Attorney, Agent, or Firm—Guy W. Shoup; Paul J. Winters

[57] ABSTRACT

Am optical writing head which is simplified in construction and reduced in production cost. The optical writing head comprises a light emitting means, and a substrate on which the light emitting means is mounted. The substrate has a light transmitting property at a portion thereof which opposes to the light emitting means. Light emitted from the light emitting means is taken out through the substrate so that it may be irradiated upon a light receiving body. A fiber bundle may be provided with one end opposed to the light emitting means and with the other end opposed to an object for exposure. Where the head is of a type wherein it contacts with an object when it optically writes, the other end of the fiber bundle is formed into a curved face, but where the head is of another type wherein it does not contact with an object when writing, a gas blowing out means is provided to assure a gap between the other end of the fiber bundle and an object. A plurality of flexible printed circuits may be connected to the light emitting means in an opposing relationship to a light emitting portion of the light emitting means.

2 Claims, 6 Drawing Sheets

TRANSMITTING RADIATION THROUGH A FLEXIBLE PRINTED CIRCUIT TO AN OPTICAL FIBER BUNDLE

This application is a division of application Ser. No. 07/228,886, Filed Aug. 4, 1988, U.S. Pat. No. 4,929,965.

BACKGROUND OF THE INVENTION

1. Field of the Invention

This invention relates to an optical writing head, and more particularly to an optical writing head for use with a printer or like machines wherein an electrophotograhic process is employed.

2. Description of the Prior Art

A conventional optical writing head is first described with reference to FIG. 12 which schematically illustrates general construction of an LED (light emitting diode) printer in which an LED array is employed for such an optical writing head.

Referring to FIG. 12, a photosensitive drum 201 having a surface layer made of a photoconductive material rotates in the direction indicated by an arrow mark. The drum 201 is at first charged uniformly by a charger 202 and then exposed to light in accordance with information of an image to be recorded by an LED array head 203 so that an electrostatic latent image is formed on the photoconductive layer of the drum 201. The latent image is then developed by a developer 204 to form a toner image which is subsequently transferred to transfer paper 206 under action of a transfer device 205. The transfer paper 206 to which the toner image has been transferred is then fed to a fixing device 207 at which the toner image is fixed to the transfer paper 206. Meanwhile, the photosensitive drum 201 from which the tone image has been transferred is then cleaned by a cleaner 208 so that it may be used again.

The LED array head 203 includes an LED element array consisting of a large number of LED chips arranged in a row in the direction of a print column as hereinafter described, and a self-condensing type rod lens array for focusing light emitted from the LED elements of the LED element array on the photosensitive drum 201.

Referring to FIG. 13, the conventional LED array head 203 includes an LED chip 222 die bonded on a ceramic substrate 221, a bonding wire wire-bonded to each of light emitting portions of the LED chip 222 for energization of the light emitting portions and connected to the LED chip 222, and a glass cover 226 for protecting a conductor pattern on the ceramic substrate 221 on which the LED chip 222 is mounted. The bonding wires and the glass cover 226 are mounted on a heat radiating plate 223 made of aluminum or a like material, and a mounting member 225 for a self-condensing type rod lens array 224 is supported on the heat radiating plate 223.

In such as LED array head as described just above, when LED chips are to be mounted on a ceramic substrate, it is necessary to hold positioning tolerances in linearity and so on as close as ±10 microns or so. However, since the width of a pad for tie bonding is 1.2 to 1.5 mm or so and hence is considerably great comparing with the width of a chip which is 0.7 to 1 mm or so, positioning of such a chip requires an optical technique which adopts a TV camera or the like. Accordingly, the efficiency in die bonding of LED chips is low, and an expensive mounting apparatus must necessarily be used.

Meanwhile, wire bonding must be done once for each light emitting portion of an LED chip (up to 64 light emitting portions are normally formed for one LED chip). For example, in the case of a commonly used LED array head for A4 letter size printing with an integration density of 300 DPI (dots per inch=about 12 dots/mm), up to 2,560 bonding wires are necessitated, and it takes about 40 minutes to one hour or so to complete such wire bonding even if a high speed wire bonder is used. Besides, even if one of the 2,560 bonding wires is bonded incompletely, the entire LED array head will be a rejected article. Accordingly, such wire bonding as described above requires close attention, which deteriorates the production efficiency and raises the production cost.

Further, since variations in tolerance in alignment of LED chips of an LED array head and in linearity in the direction of height of light emitting portions must necessarily be within severe tolerances of ±100 microns over the entire width (216 mm in the case of the A4 size) of the LED chips, the warp and bend of a ceramic substrate itself are restricted. Accordingly, a ceramic substrate itself must necessarily be high in accuracy and 100% inspection is required, which makes substrates expensive.

Further, since a self-condensing type rod lens array is carried on a heat radiating plate on which a ceramic substrate is mounted, errors in dimension of those elements are accumulated. Accordingly, it is also a drawback that a required degree of accuracy is not attained. Tolerances in positioning of an existing rod lens array of the self-condensing type are ±0.1 mm over the entire length of the array, which requires optical confirmation of tolerances in mounted position of the array and requires provision of the LED array head with a mechanism for enabling positioning with a high degree of accuracy. Accordingly, the production cost is raised in regard to man-hours for assembly, production equipment, number of parts and so on.

SUMMARY OF THE INVENTION

It is an object of the present invention to provide an optical writing head which is simplified in construction and reduced in production cost.

It is another object of the present invention to provide an optical writing head which is high in efficiency in taking light from a light emitting means and also high in heat radiating property.

It is a further object of the present invention to provide an optical writing head which can have smooth contact with an object for exposure when the object is to be exposed to light in a condition wherein it contacts with the optical writing head.

It is a still further object of the present invention to provide an optical writing head which can remain in a spaced condition by a fixed distance from an object for exposure when the object is to be exposed to light without contacting with the optical writing head.

It is a yet further object of the present invention to provide an optical writing head which eliminates a wire bonding step to attain reduction in number of steps and improvement in production efficiency.

In order attain the objects, according to one aspect of the presennt invention, there is provided an optical writing head which comprises a light emitting means, and a substrate on which the light emitting means is mounted, the substrate having a light transmitting property at a portion thereof which opposes to the light emitting means, whereby light emitted from the light emitting means is taken out through the substrate so that it may be irradiated upon a light receiving body.

According to another aspect of the present invention, there is provided an optical writing head which comprises a light emitting means, a multi-layer wiring member including a plurality of flexible printed circuits connected to the light emitting means in an opposing relationship to a light emitting portion of the light emitting means, a fiber bundle including a plurality of opitcal fibers and having and end portion opposed to the light emitting portion of the light emitting means, and a fiber plate in which the fiber bundle is buried and on which the multi-layer wiring member.

According to a further aspect of the present invention, there is provided an optical writing head which comprises a light emitting means, a substrate on which the light emitting means is mounted in a flip chip manner such that a light emitting portion thereof may be opposed to a face of the substrate, and a fiber bundle including a plurality of optical fibers and buried in the substrate such that one end portion thereof may oppose to the light emitting portion of the light emitting means, the other end portion of the fiber bundle being formed in a curved face.

According to a still further aspect of the present invention, there is provided an optical writing head which comprises a fiber plate carrying thereon a plurality of optical fibers such that one end portions of the optical fibers oppose to a flexible object for exposure while the other end portions oppose to a light emitting portion of a light emitting means, and a gas blowing out means for blowing out gas therefrom to urge the object for exposure in a direction to move away from the one end portions of the optical fibers.

With the optical writing head of the present invention, following effects can be anticipated.

(1) Where the LED chip is mounted in a flip chip manner on the transparent substrate, a wire bonding step which has been required in a conventional production step is eliminated. Consequently, the number of production steps is reduced so that the production efficiency is improved and the production cost is reduced.

(2) Particularly where a glass substrate is employed as the substrate, a fine pattern can be formed readily on a surface of the glass substrate by a thin film forming step because the smoothness of the surface of the substrate is high. Besides, a substrate having a high degree of accuracy without a bend or deformation can be obtained readily, and accordingly a high degree of positioning accuracy of an LED chip can be attained readily.

(3) Since a mounted condition of the light emitting means can be confirmed from the side of the substrate, positioning of the lighlt emitting means upon mounting is facilitated.

(4) Since the optical fiber has no focal point as in the case of a self-condensing type rod lens array, the distance between a light emitting portion of the light emitting means and an object for exposure can be reduced, and the size of the device can be reduced.

(5) Since almost all of light emitted from a light emitting portion of the light emitting means is introduced into the fiber bundle and irradiated efficiently upon an object for exposure, the energy for emission of light to be supplied to the light emitting means can be reduced. Consequently, the life of the light emitting means can be increased.

(6) Where the substance of a high refractivity is filled up between the substrate and the light emitting means, the efficiency in taking out of light from the light emitting means is improved, and a cooling effect for the light emitting means is also attained.

(7) Where the end face of the fiber bundle which opposes to an object for exposure is formed into a curved face, even if an object for exposure is exposed to light by the fiber bundle in a condition wherein it contacts with the fiber bundle, there is no possibility that the end face of the fiber bundle may damage the object for exposure because they contact smoothly with each other.

(8) Where the gas blowing out means for blowing out gas therefrom is provided near the optical fiber, the gap between the opitcal fiber and an object for exposure can be maintained by gas blown out from the gas blowing out means. Accordinglyh, the gap can be assured readily.

The above and other objects, features and advantages of the present invention will become apparent from the following description and the appended claims, taken in conjunction with the accompanying drawings.

BREIF DESCRIPTION OF THE DRAWINGS

Figure 4:
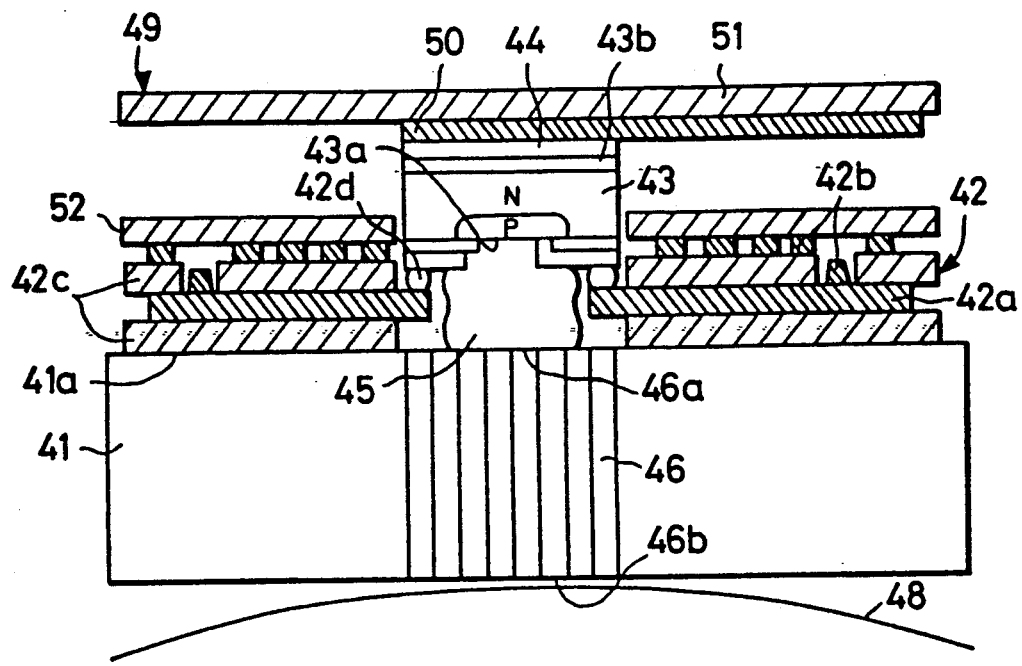
FIG. 4 is a vertical sectional view of a structure of an optical writing head showing a third embodiment of the present invention.
Figure 6:
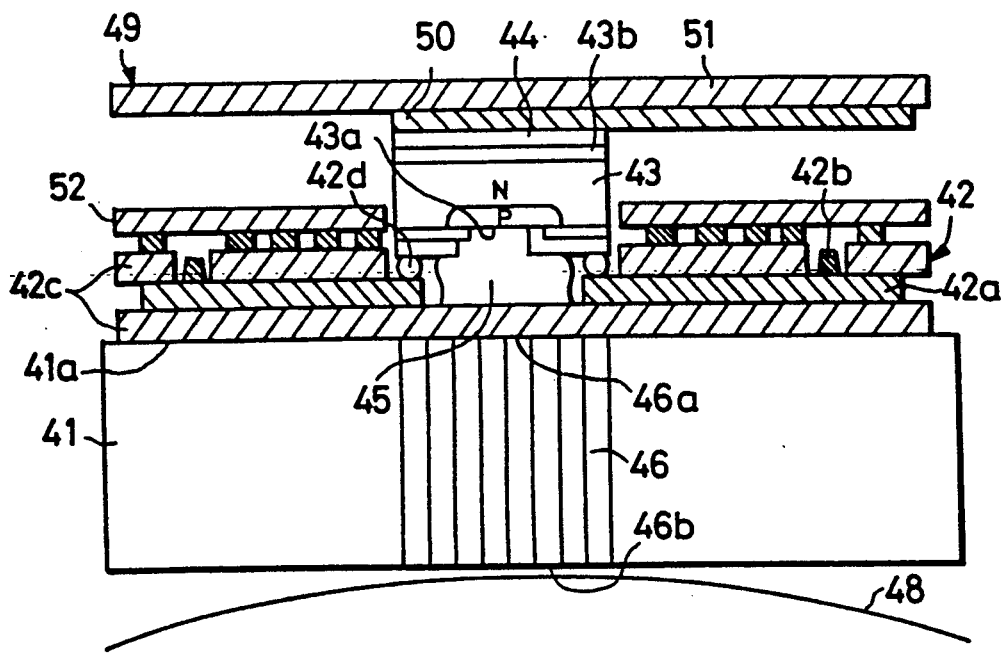
Figure 5A:
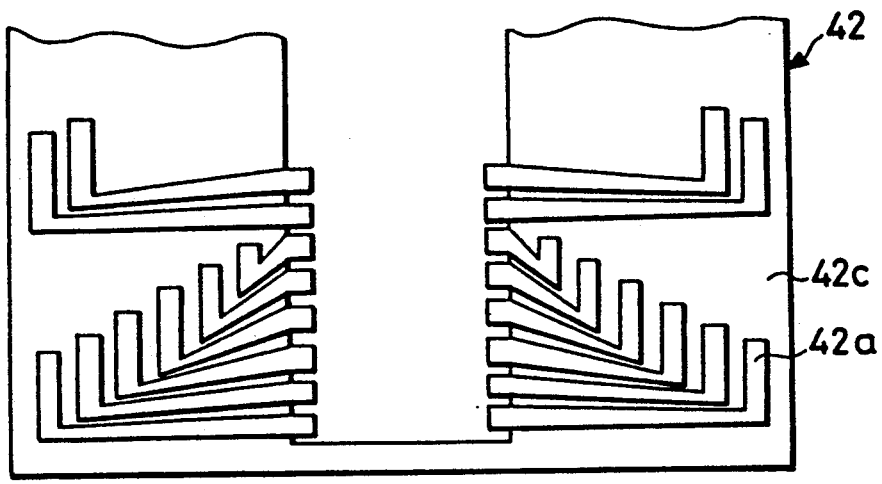
Figure 5B:
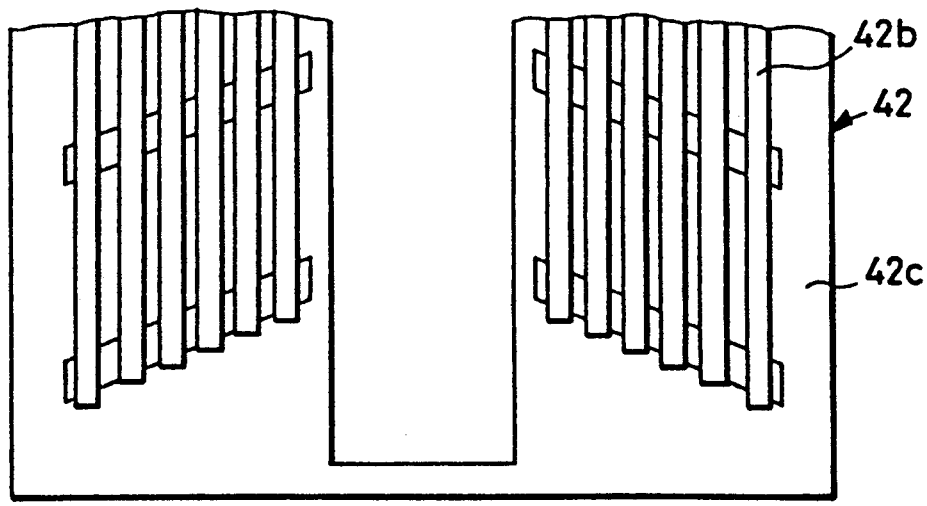
Figure 7:
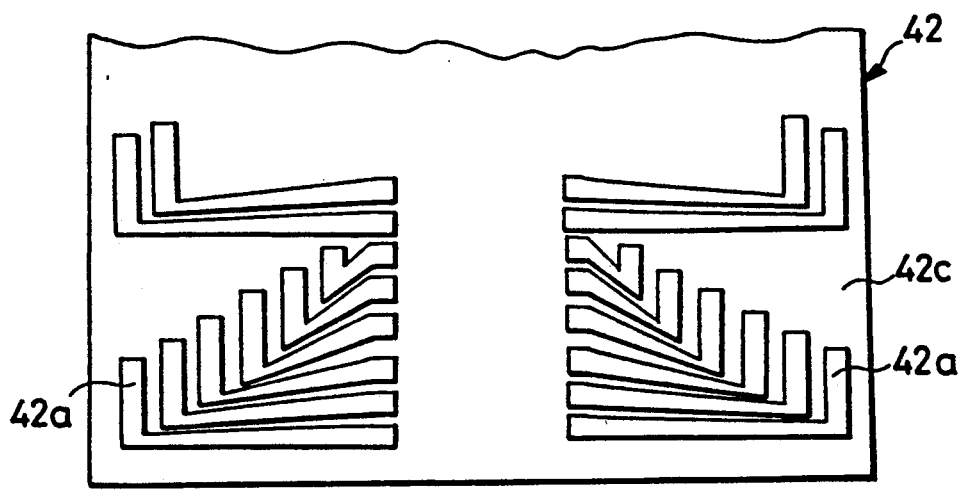
Figure 8:
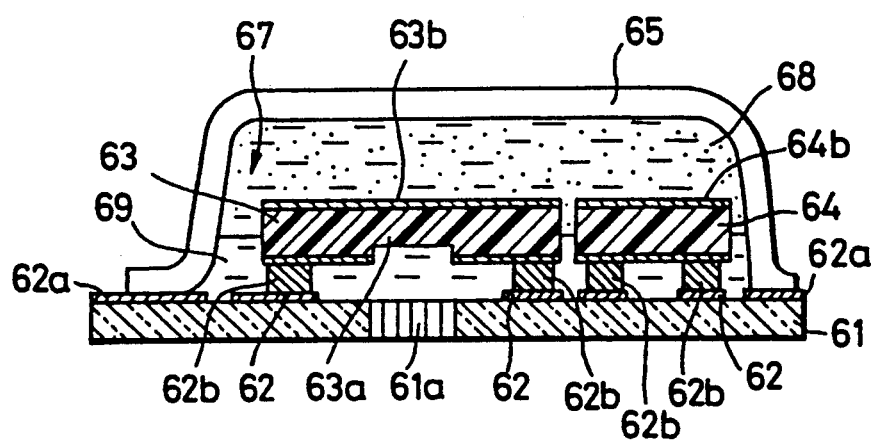
Figure 9:
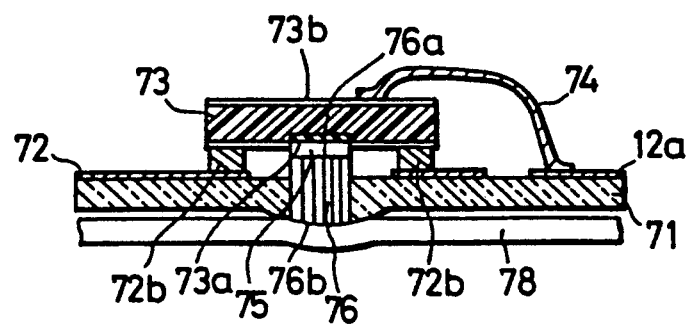
Figure 10:
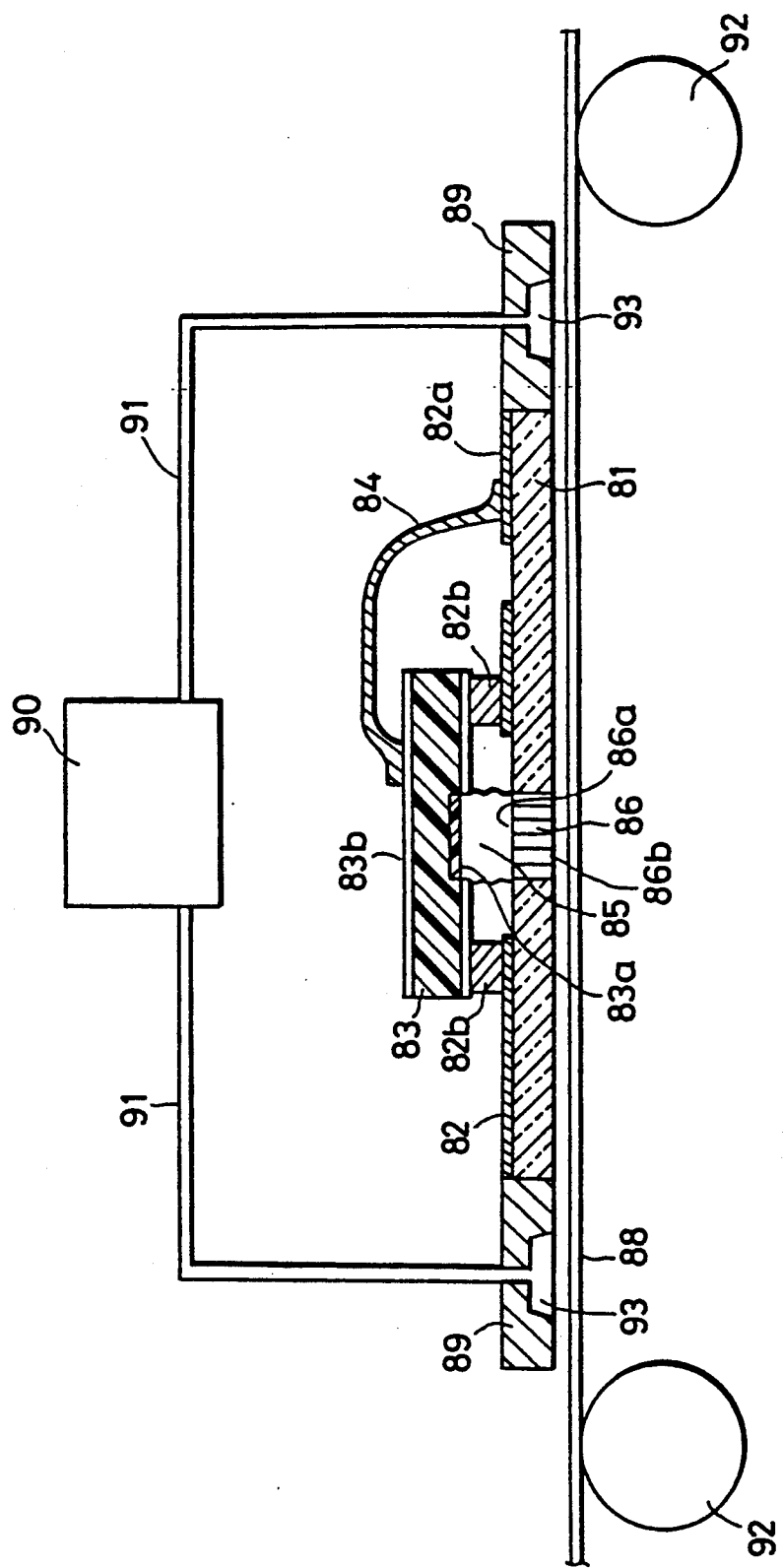
Figure 11:
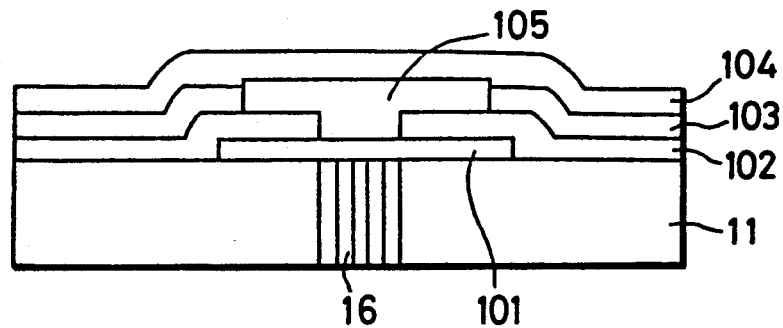
Figure 12:
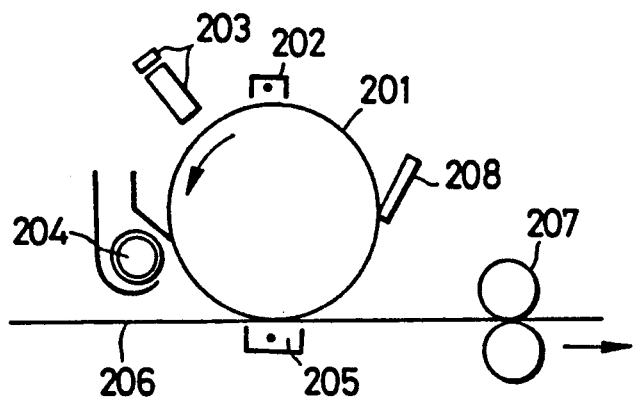
Figure 13:
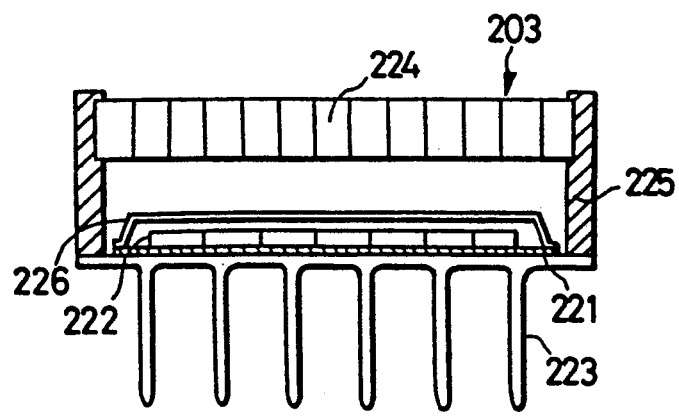

FIGS. 5(A) and 5(B) are plan views of flexible printed circuits which are used in the optical writing head of FIG. 4;

FIG. 6 is a sectional view of a structure of an optical writing head showing a fourth embodiment of the present invention;

FIG. 7 is a plan view of a flexible printed circuit which may be used in the optical writing head of FIG. 6;

FIG. 8 is a sectional view of a structure of an optical writing head showing a fifth embodiment of the present invention;

FIG. 9 is a sectional view of a structure of an optical writing head showing a sixth embodiment of the present invention;

FIG. 10 is a sectional view of a structure of an optical writing head showing a seventh embodiment of the present invention;

FIG. 11 is a sectional view of a structure of an optical writing head showing a eighth embodiment of the present invention;

FIG. 12 is a schematic illustration showing construction of a conventional electro-photographic printer; and FIG. 13 is a sectional view of a structure of a conventional optical writing head.

DESCRIPTION OF THE PREFERRED EMBODIMENTS

Figure 1:
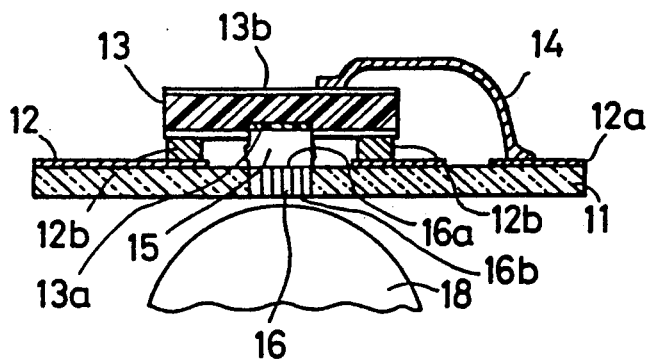
FIG. 1 is a vertical sectional view of a structure of an optical writing head showing a first embodiment of the present invention.
Figure 2:
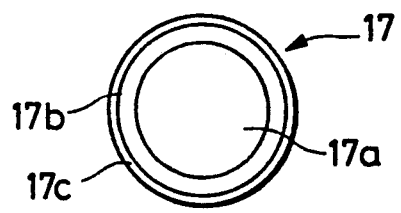
FIG. 2 is a cross sectional view of an optical fiber used in the optical writing head of FIG. 1.

Referring first to FIG. 1, there is shown an optical writing head according to a first embodiment of the present invention. The optical writing head includes a transparent substrate 11 made of glass or a like material, and a desired fine conductor pattern 12 formed on a surface of the transparent substrate 11 by a thin film forming step. An LED chip 13 is disposed above and connected to the conductor pattern 12 by way of solder bumps 12b such that a light emitting portion 13a thereof may oppose to the substrate 11. A back electrode 13b of the LED chip 13 is electrically coupled to a ground pattern 12a on the substrate 11 by way of a lead wire 14. An end portion 16a of a fiber bundle 16 is disposed near the light emitting portion 13a of the LED chip 13 with a transparent synthetic resin block 15 interposed therebetween. The fiber bundle 16 is composed of an aggregate of a large number of optical fibers 17 of a diameter of 10 to 25 microns as hereinafter described. It is to be noted that the fiber bundle 16 is held in a condition wherein it is buried in the substrate 11. Referring to FIG. 2, each of the optical fibers 17 has a three-layer structure composed of a core 17a made of a glass material having a high refractivity, a clad 17b made of a glass material of a lower refractivity and formed on an outer periphery of the core 17a, and an absorbing body 17c made of carbon and formed on an outer periphery of the clad 17b.

With the optical writing head having such a construction as described above, light emitted from the light emitting portion 13a of the LED chip 13 is, as seen in FIG. 1, introduced into the end portion 16a of the fiber bundle 16 via the transparent synthetic resin block 15, transmitted in a high efficiency within the fiber bundle 16 and then irradiated from the other end 16b of the fiber bundle 16 upon a surface of an object 18 for exposure such as a photosensitive drum.

Figure 3:
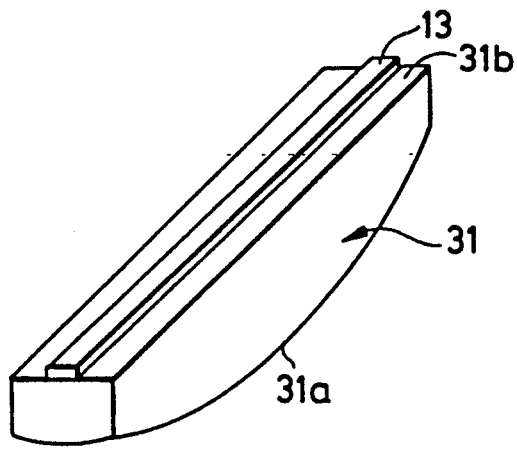
FIG. 3 is a perspective view of an optical writing head showing a second embodiment of the present invention.

Subsequently, a second embodiment of the present invention will be described with reference to FIG. 3.

The present embodiment employs either a spherical lens or an aspherical lens in place of the transparent substrate 11 and the fiber bundle 11 of the first embodiment described above. In particular, a lens 31 has a spherical or aspherical lower face 31a while an LED chip 13 is mounted in a flip chip manner on an upper face 31b of the lens 31. Light emitted from the LED chip 13 is thus focused on an object for exposure not shown to form an image on the object.

Referring now to FIG. 4, a third embodiment of the present invention is shown. An optical writing head of the present invention has an LED chip mounted thereon by way of an FPC (flexible printed circuit). In particular, the optical writing head includes a fiber plate 41 made of glass, plastics or a like material, and a two-layer FPC 42 located on a surface 41a of the fiber plate 41. The FPC 42 is composed of two polyimide layers 42c on which desired conductor patterns 42a and 42b are formed from copper foil. An LED chip 43 is disposed above and bonded to the conductor pattern 42a by way of solder bumps 42b such that a light emitting portion 43a thereof may oppose to the FPC 42. A back electrode 43b of the LED chip 43 is coupled to a ground pattern 50 on another FPC 49. It is to be noted that the FPC 49 has a structure wherein the conductor pattern 50 of copper foil is formed on a polyimide layer 51 similarly to the FPC 42. In order to prevent short-circuiting between the FPC 49 and the FPC 42, an insulating layer 52 of polyimide is provided on an upper face of the FPC 42. A fiber bundle 46 is buried in the fiber plate 41 with an end portion 46a thereof disposed near the light emitting portion 43a of the LED chip 43 with a transparent synthetic resin block 45 of a high refractivity interposed therebetween. The fiber bundle 46 is composed of an aggregate of a large number of such optical fibers 17 of a diameter of 10 to 25 microns as shown in FIG. 2.

With the optical writing head having such a construction as described above, light emitted from the light emitting portion 43a of the LED chip 43 is, as seen in FIG. 4, introduced into the end portion 46a of the fiber bundle 46 via the transparent synthetic resin block 45, transmitted in a high efficiency within the fiber bundle 46 and then irradiated from the other end 46b of the fiber bundle 46 upon a surface of an object 48 for exposure such as a photosensitive drum.

A process of production of the optical writing head of the present invention will be described subsequently.

Referring to FIGS. 5(A) and 5(B), first, conductor patterns 42a and 42b for the first and second layers of a two-layer FPC 42 to be produced are formed on two polyimide films, and then the conductor patterns 42a and 42b are etched to expose contacts thereof. Then, the two polyimide films are placed one on the other, and then a polyimide film for an insulating layer 52 is placed on the two overlapping polyimide films, whereafter the conductor patterns 42a and 42b are electrically coupled to each other either by welding with large current pulses or by soldering, thereby completing an FPC 42 having conductor patterns in two layers therein. Thereupon, a portion of the first polyimide layer 42c which is to oppose the light emitting portion 43a of an LED chip 43 is cut away so that light emitted from the light emitting portion 43a may be received directly by a fiber bundle 46 without being intercepted by the FPC 42. Subsequently, the conductor pattern 42a of the FPC and an LED chip 43 are connected to each other using a TAB (tape automated bonding) method. After then, a fiber plate 41 in which a fiber bundle 46 is buried is securely adhered to the FPC 42. Thereupon, synthetic resin material 45 is put between the light emitting portion 43a of the LED chip 43 and the fiber bundle 46. Finally, silver paste 44 is applied to the back electrode 43b of the LED array 43, and then another FPC 49 is connected to the back electrode 43b by baking, thereby completing an optical writing head.

Subsequently, a fourth embodiment of the present invention will be described with reference to FIGS. 6 and 7. An optical writing head of the present embodiment is similar in structure to the optical writing head of the third embodiment described above except that a first polyimide layer of an FPC interposed between a light emitting portion of an LED array and a fiber plate is not cut away. The structure wherein no cut away portion is formed in the FPC increases the strength of the FPC and facilitates positioning of the first and second polyimide layers of the FPC relative to each other, which remarkably improves the operability in assembly. Meanwhile, since the FPC is interposed between the light emitting portion of the LED array and the fiber plate, the transmission efficiency of light is reduced accordingly. However, if an LED chip which emits light of a long wavelength is used, the transmittivity is increased so that the reduction in transmission efficiency can be compensated for.

Referring now to FIG. 8, an optical writing head according to a fifth embodiment of the present invention is shown. The optical writing head is improved in its heat radiation by a cover which covers a light emitting means and a filler which is filled up between the cover and the light emitting means. In particular, the optical writing head includes a substrate 61 made of glass or a like material and having a fiber bundle 61a buried therein. The fiber bundle 61a is composed of a large number of optical fibers. A desired fine conductor pattern 62 is formed on a surface of the substrate 61 by a thin film forming process. An LED chip 63 and a driver means 64 such as an IC chip for controlling the LED chip 63 are disposed above and connected to the conductor pattern 62 by way of solder bumps 62b. A light emitting portion 63a of the LED chip 63 is opposed to the fiber bundle 61a buried in the substrate 61. The LED chip 63 and the driver means 64 are enclosed in a spaced relationship above the substrate 61 by means of a metal cover 65. Fillers are filled in a spacing 67 between the substrate 61 and cover 65. More particularly, conductive paste or conductive sealing synthetic resin 68 in which metal powder is mixed to raise the electric conductivity and the heat conducitivity is filled up between the cover 65 and a back electrode 63b of the LED chip 63 as well as the driver means 64, and the back electrode 63b of the LED chip 63 is electrically coupled to a ground pattern 62a of the substrate 61 by way of the conductive paste or conductive sealing synthetic resin 68 and the metal cover 65. Meanwhile, transparent resin 69 is filled up between the light emitting portion 63a of the LED chip 63 and the substrate 61 so light emitted from the light emitting portion 63a is irradiated upon an object for exposure not shown via the transparent resin 69 and the fiber bundle 61a. It is to be noted that while the transparent resin 69 is shown filled up over the entire area of the substrate 61 in the spacing 47 in FIG. 8, it must be filled only between the light emitting portion 63a of the LED chip 63 and the fiber bundle 61a.

A sixth embodiment of the present invention will be described below with reference to FIG. 9. An optical writing head of the present invention is constituted such that an end face of a fiber bundle which opposes to an object for exposure is formed into a curved face so that the optical writing head may contact smoothly with an object for exposure when the object is exposed to light in a condition wherein it is held in contact with the optical writing head. In particular, the optical writing head includes a transparent substrate 71 made of glass or a like material, and a desired fine conductor pattern 72 formed on a surface of the transparent substrate 71 by a thin film forming step. An LED chip 73 is disposed above and connected to the conductor pattern 72 by solder bumps 72b such that a light emitting portion 73a thereof may oppose to the substrate 71. A back electrode 73b of the LED chip 73 is coupled to a gound pattern 72a on the substrate 71 by way of a lead wire 74. An end portion 76a of a fiber bundle 76 is disposed near the light emitting portion 73a of the LED chip 73 with a transparent synthetic resin block 75 interposed therebetween. The fiber bundle 76 is composed of an aggregate of a large number of such optical fibers 17 of a diameter of 10 to 25 microns as shown in FIG. 2. It is to be noted that the fiber bundle 76 is held in a condition wherein it is buried in the substrate 71.

With the optical writing head having such a construction as described above, light emitted from the light emitting portion 73a of the LED chip 73 is, as seen in FIG. 9, introduced into the end portion 76a of the fiber bundle 76 via the transparent synthetic resin block 75, transmitted in a high efficiency within the fiber bundle 76 and then irradiated upon a surface of an object 78 for exposure such as a photosensitive belt which contacts with the other end portion 76b of the fiber bundle 76 which is formed into a curved face.

A seventh embodiment of the present invention will be described subsequently. An optical writing head of the present embodiment is constituted such that a gas blowing out means for blowing out gas therefrom is provided near an optical fiber so that the distance of a gap between an object for exposure and the optical fiber may be maintained fixed when the object is exposed to light in a condition wherein it does not contact with the optical writing head. In particular, referring to FIG. 10, the optical writing head includes a fiber plate 81 made of glass, plastics or a like material, and a desired fine conductor pattern 82 formed on a surface of the fiber plate 81 by a thin film forming step. An LED chip 83 is disposed above and connected to the conductor pattern 82 by solder bumps 82b such that a light emitting portion 83a thereof may oppose to the fiber plate 81. A back electrode 83b of the LED chip 83 is electrically coupled to a ground pattern 82a on the fiber plate 81 by way of a lead wire 84. An end portion 86a of a fiber bundle 86 is disposed near the light emitting portion 83a of the LED chip 83 with a transparent synthetic resin block 85 interposed therebetween. The fiber bundle 86 is composed of an aggregate of a large number of such optical fibers 17 of a diameter of 10 to 25 microns as shown in FIG. 2. It is to be noted that the fiber bundle 86 is held in a condition wherein it is buried in the substrate 81. A gas blowing out means 89 is provided for blowing out gas fed thereto from a pump 90 via a pipe 91 toward an object 88 for exposure to bend the object 88 between a pair of rollers 92 to assure a gap between an end portion 86b of the fiber bundle 86 and the object 88 for exposure. It is to be noted that the gas blowing out means 89 has a blowing out port 93 provided therein which has a greater area than the pipe 91 so that the pressure of gas upon the object for exposure may be maintained fixed over a wide area.

With the optical writing head having such a construction as described above, light emitted from the light emitting portion 83a of the LED chip 83 is, as seen in FIG. 10, introduced into the end portion 86a of the fiber bundle 86 via the transparent synthetic resin block 85, transmitted in a high efficiency within the fiber bundle 86 and then irradiated upon a surface of an object 88 for exposure such as a photosensitive belt from the other end portion 86b of the fiber bundle 86. It is to be noted that while in the present embodiment the gas blowing out means 89 is provided on the outer side of the fiber plate 81, the blowing out opening 23 may be otherwise provided directly in the fiber plate 81.

Subsequently, an eight embodiment of the present invention will be described with reference to FIG. 11. In an optical writing head of the present invention shown, an electroluminescence element called EL element is mounted in place of the LED chip 13 of the first embodiment described hereinabove. In particular, a transparent conductor film 101, a lower electrode 102, an insulator layer 103, an upper electrode 104 and a light emitting layer 105 are placed one on another in layers on a transparent substrate 11 in which a fiber bundle 16 is buried such that light emitted from the EL element may be irradiated upon an object for exposure not shown by way of the fiber bundle 16.

The present invention is not limited to the embodiments described hereinabove, and various alterations and modifications can be made to the embodiments without departing from the scope and spirit of the present invention. For example, the light emitting means may be any other suitable light emitting device such as a semiconductor laser, an LD array and a fluorescent display tube.

What is claimed is:

1. An optical writing head comprising:
   a light emitting means emitting radiation in a first direction;
   at least one flexible printed circuit having formed thereon at least one pattern of electrode, said pattern facing a second direction opposite to said first direction;
   a fiber plate supporting said at least one flexible printed circuit;
   a plurality of optical fibers buried in said fiber plate such that one end of each optical fiber is positioned to receive such radiation, said radiation arriving from said light emitting means to said end of said optical fiber through the material of said at least one flexible printed circuit.

2. An optical writing head as in claim 1, wherein said at least one flexible printed circuit comprises a plurality of layers, each layer except one having a cavity therein for said radiation to shine through.

* * * * *

UNITED STATES PATENT AND TRADEMARK OFFICE
CERTIFICATE OF CORRECTION

```
PATENT NO.   :   5,005,029
DATED        :   April 2, 1991
INVENTOR(S)  :   Masashi Fuse
```

It is certified that error appears in the above-identified patent and that said Letters Patent is hereby corrected as shown below:

```
ON THE TITLE PAGE:
   The Title should read --Optical Writing Head
Transmitting Radiation Through A Flexible Printed Circuit To
An Optical Fiber Bundle--.
```

Signed and Sealed this

Fifteenth Day of September, 1992

*Attest:*

DOUGLAS B. COMER

*Attesting Officer*     Acting Commissioner of Patents and Trademarks